United States Patent [19]
Wakamatsu

[11] Patent Number: 6,043,767
[45] Date of Patent: Mar. 28, 2000

[54] APPARATUS AND METHOD FOR DETECTING AND COMPENSATING FOR AN OFFSET WHILE REDUCING NOISE INFLUENCE

[75] Inventor: Masataka Wakamatsu, Kanagawa, Japan

[73] Assignee: Sony Corporation, Tokyo, Japan

[21] Appl. No.: 08/985,707

[22] Filed: Dec. 5, 1997

[30] Foreign Application Priority Data

Dec. 9, 1996 [JP] Japan .................................. 8-328394

[51] Int. Cl.$^7$ ...................................................... H03M 1/62
[52] U.S. Cl. .......................................... 341/139; 341/118
[58] Field of Search ...................................... 341/118, 139

[56] References Cited

U.S. PATENT DOCUMENTS

| | | | |
|---|---|---|---|
| 4,972,189 | 11/1990 | Polito et al. ............................. | 341/118 |
| 4,996,529 | 2/1991 | Connell .................................... | 341/118 |
| 4,999,628 | 3/1991 | Kakubo et al. .......................... | 341/139 |
| 5,177,697 | 1/1993 | Schanen et al. ................... | 364/571.04 |
| 5,194,868 | 3/1993 | Bahng et al. ............................ | 341/167 |
| 5,329,281 | 7/1994 | Baumgartner et al. ................. | 341/139 |
| 5,343,200 | 8/1994 | Matsui .................................... | 341/139 |
| 5,422,643 | 6/1995 | Chu et al. ............................... | 341/143 |
| 5,721,547 | 2/1998 | Longo .................................... | 341/118 |

*Primary Examiner*—Brian Young
*Assistant Examiner*—Jason L W Kost
*Attorney, Agent, or Firm*—Frommer Lawrence & Haug, LLP.; William S. Frommer

[57] ABSTRACT

Upon the power-on, a digital signal processing circuit supplies an AGC signal to an AGC amplifier to squelch it substantially, thereby prohibiting an analog signal from being input to an A/D converter 6 via a DC level setting circuit. In this state, a DC level that is set by the DC level setting circuit is A/D-converted by the A/D converter and a resulting value is input to the digital signal processing circuit. The digital signal processing circuit calculates and stores, as a DC offset value, a difference between the received DC level and the center value of the dynamic range of the A/D converter. In a stationary state, the AGC amplifier is caused to operate normally and the offset value is subtracted from data that is supplied from the A/D converter. Resulting data is output from an output terminal.

14 Claims, 5 Drawing Sheets

APPARATUS AND METHOD FOR DETECTING AND COMPENSATING FOR AN OFFSET WHILE REDUCING NOISE INFLUENCE

BACKGROUND OF THE INVENTION

The present invention relates to an offset compensation circuit and method and, particularly, to an offset compensation circuit and method which enable offset compensation with a simple configuration.

It is known that television broadcasting schemes of satellite broadcasting and CATV digitally transmit television signals or the like by using modulation techniques such as QPSK and QAM. The receiving circuits receiving the broadcasting radio waves of those techniques convert a received analog signal to digital and perform digital processing on the resulting signal.

In demodulating a transmission signal in the above systems, the center value of the amplitude of a reception signal does not necessarily coincide with the ideal center value because of variations in the resistance of external resistors that relate to the A/D conversion. For example, if there is a 2% to 3% variation as a DC offset, an A/D converter having nominal resolution of 8 bits can only exhibit resolution lower than 8 bits. Therefore, in receiving circuits, a DC offset is detected from actual demodulation data and compensation is made therefor.

One method for detecting a DC offset is to sample the A/D-converted data, calculate an average, and employ the average as a DC offset value.

Another method is to determine the maximum and minimum values of data obtained by actually converting a reception signal from analog to digital. The deviation of the center of the maximum and minimum values from the center of the dynamic range of an A/D converter is used as a DC offset value. A further method is to extract only high-frequency components using a high-pass digital filter.

In the above described method of detecting a DC offset by averaging outputs of an A/D converter, it is necessary to average large numbers (ten or more) of data because even an analog signal has a DC component in a short period. This method therefore has a problem of a large circuit scale, as does the above method of using a digital filter.

Furthermore, the above described method of determining a DC offset from the center of the maximum and minimum values of an A/D converted reception signal and the center of a dynamic range is disadvantageous because it is easily affected by noise. Therefore, it is difficult to apply this method to an analog signal (transmission signal) containing a large amount of noise components.

SUMMARY OF THE INVENTION

The present invention has been made in view of the above circumstances, and an object of the invention is to enable offset detection and compensation with a simple configuration while reducing the influence of noise.

The invention provides an offset compensation circuit which squelches a DC offset component of an analog-to-digital converter. The invention comprises dynamic range setting means for setting a dynamic range of the analog-to-digital converter; DC level setting means for setting a DC level of the analog signal that is input to the analog-to-digital converter; detecting means for detecting an offset between a predetermined level in the dynamic range that is set by the dynamic range setting means and the DC level that is set by the DC level setting means; prohibiting means for prohibiting input of the analog signal to the analog-to-digital converter while the detecting means detects the offset; and compensating means for compensating for the offset.

In the above offset compensation circuit, the detecting means may detect, as the offset, a difference between a center value of the dynamic range and the DC level.

The prohibiting means may comprise an AGC amplifier for controlling an amplitude of the analog signal, and the AGC amplifier may be controlled so as to minimize the amplitude of the analog signal that is input to the analog-to-digital converter while the detecting means detects the offset.

The above offset compensation circuit may further comprise storing means for storing a value of the detected offset, wherein the detected offset value is stored in the storing means after an offset detecting operation is stopped after it has been performed for a predetermined time.

A normal operation may be started after the offset detecting operation is stopped, and during the normal operation the offset value that is stored in the storing means may be subtracted from an output of the analog-to digital converter.

The offset compensation circuit may further comprise monitoring means for monitoring during the normal operation whether data is input, wherein the offset detecting operation is restarted when it is judged, as a result of monitoring, that no data has been input more than a predetermined time.

The compensating means may control the DC level setting means in accordance with the offset.

Further, the invention provides an offset compensation method for eliminating a DC offset component of an analog-to-digital converter, comprising the steps of setting a dynamic range of the analog-to-digital converter; setting a DC level of the analog signal that is input to the analog-to-digital converter; detecting an offset between a predetermined level in the set dynamic range and the set DC level; prohibiting input of the analog signal to the analog-to-digital converter while detecting the offset; and compensating for the detected offset.

DETAILED DESCRIPTION OF THE PREFERRED EMBODIMENTS

Figure 1:
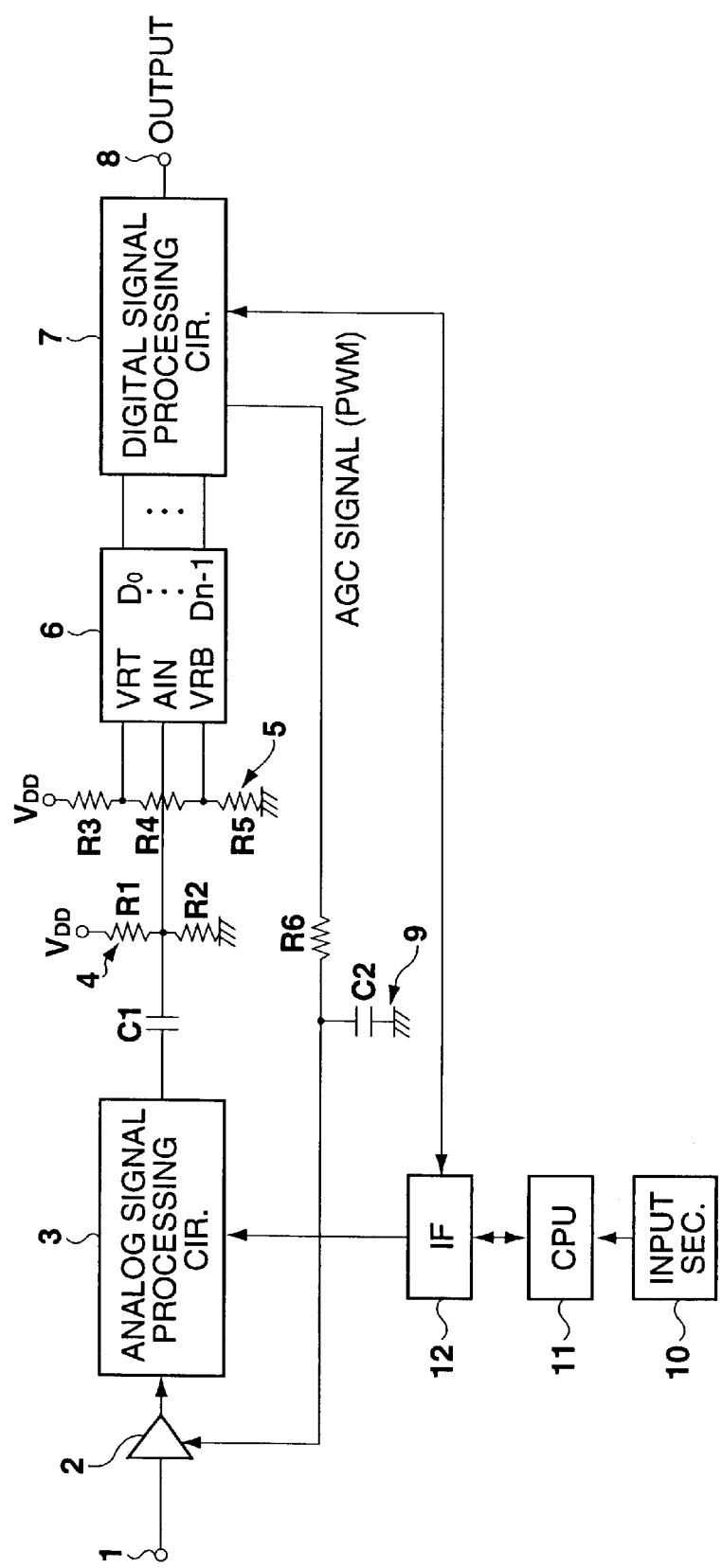
FIG. 1 is a block diagram showing an exemplary configuration of an offset compensation circuit according to the present invention.

FIG. 1 is a block diagram illustrating an embodiment of an offset compensation circuit according to the present invention. A reception signal of a television broadcast signal that has been modulated, for example, by the QPSK or QAM modulation technique, and then digitally transmitted is input to terminal 1. An AGC amplifier 2 controls, to a predetermined level, the amplitude of the reception signal that comes from terminal 1 and outputs a resulting signal to an analog signal processing circuit 3. The analog signal processing circuit 3 adjusts the phase characteristic and other things of the incoming analog reception signal to predetermined characteristics and performs quadrature detection.

Capacitor $C_1$ removes the DC component of the signal outputted from the analog signal processing circuit 3. A DC level setting circuit 4, which consists of resistors $R_1$ and $R_2$, gives a predetermined DC level to a resulting signal. The resulting signal is input to terminal AIN of the A/D converter 6. Terminals VRT and VRB of the A/D converter 6 are supplied with the upper and lower limits, respectively, of a dynamic range set by resistors $R_3$–$R_5$ of a dynamic range setting circuit 5. The A/D converter 6 divides the dynamic range that is set at terminals VRT and VRB into a predetermined number of levels and outputs n-bit digital data according to that division to a digital signal processing circuit 7.

Figure 2:
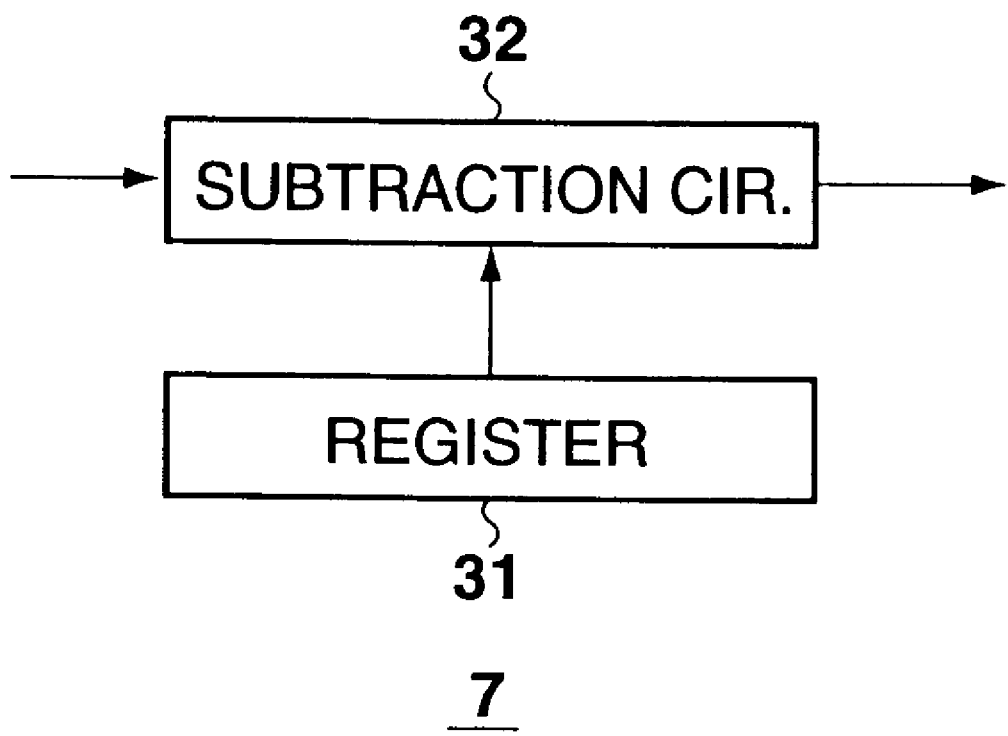
FIG. 2 is a block diagram showing part of the internal configuration of a digital signal processing circuit 7 shown in FIG. 1.

For example, the digital signal processing circuit 7 incorporates a register 31 and a subtraction circuit 32 as shown in FIG. 2. The register 31 holds a detected DC offset value. The subtraction circuit 32 subtracts the DC offset value that is held by the register 31 from digital data that is supplied from the A/D converter 6, and outputs resulting data from an output terminal 8.

Further, the digital signal processing circuit 7 generates a PWM signal as an AGC signal for controlling the AGC amplifier 2 in accordance with the level of the digital data that is supplied from the A/D converter 6. The PWM signal is integrated by an integration circuit 9 which consists of a resistor $R_6$ and a capacitor C2 and then supplied to the AGC amplifier 2 as a control signal.

A CPU 11 controls the analog signal processing circuit 3 and the digital signal processing circuit 7 via an interface (IF) 12 in accordance with an instruction from an input section 10, thereby controlling the A/D converting operation.

Figure 3:
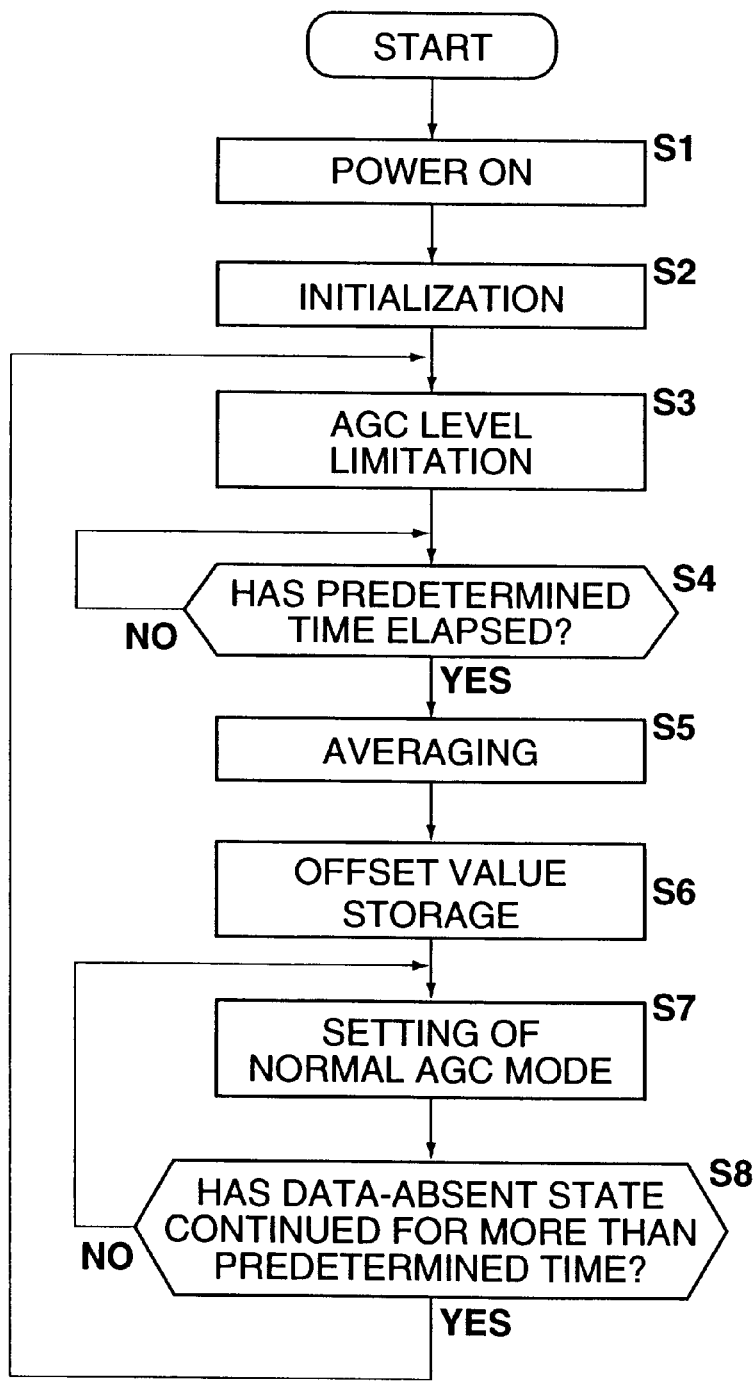
FIG. 3 is a flowchart showing the operation of the offset compensation circuit of FIG. 1.

The operation of the above offset compensation circuit will be described with reference to FIG. 3. At step S1, the user manipulates the input section 10 to turn on the power and cause the offset compensation circuit to start operating. At step S2, the CPU 11 controls the analog signal processing circuit 3 and the digital signal processing circuit 7 via the interface 12 to initialize those circuits. At step S3, the CPU 11 controls the digital signal processing circuit 7 to have it execute an AGC level limiting process.

When receiving an AGC level limiting instruction from the CPU 11 via the interface 12, the digital signal processing circuit 7 generates an AGC signal for minimizing the gain of the AGC amplifier 2, which is input to the AGC amplifier 2 via the integration circuit 9. As a result, the AGC amplifier 2 reduces the amplitude of an analog signal that is supplied from the terminal 1 to the minimum value (substantially equal to 0). In other words, the AGC amplifier squelches the received analog signal.

At step S4, the CPU 11 waits until a preset time elapses. The preset time is the time that is required for the output of the AGC amplifier 2 to decay sufficiently. After a lapse of the preset time, the process goes to step S5, where the CPU 11 controls the digital signal processing circuit 7 via the interface 12 to have it execute an averaging process.

Figure 4:
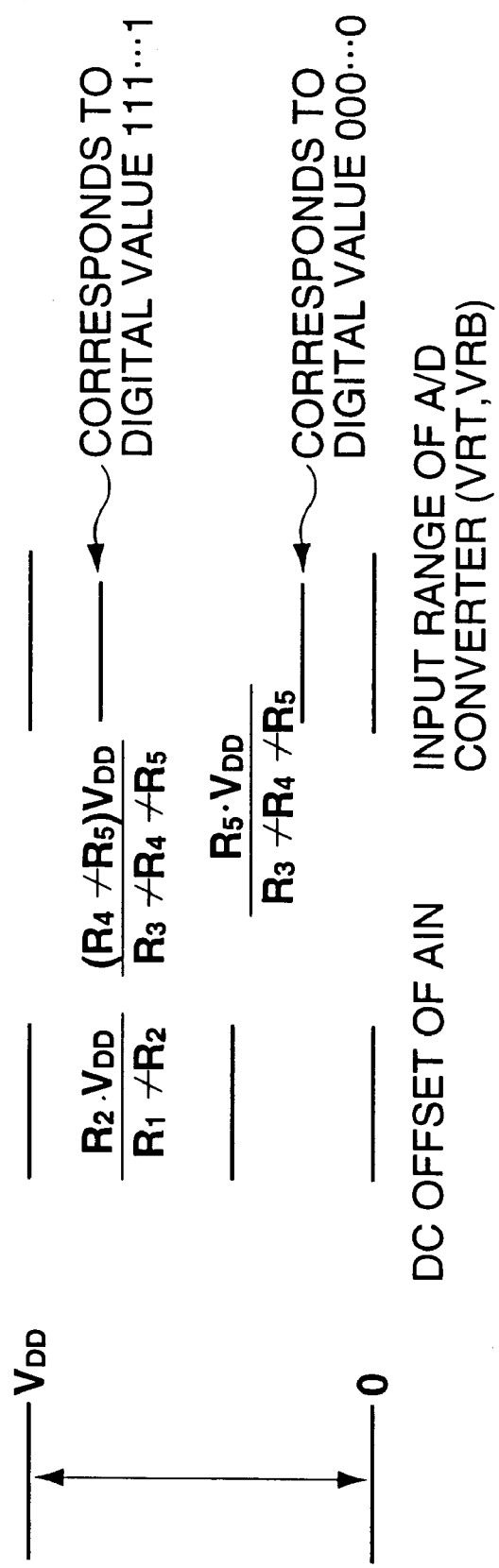
FIG. 4 illustrates setting values in a DC level setting circuit 4 and a dynamic range setting circuit 5 that are shown in FIG. 1.

The averaging process will be described below. As shown in FIG. 4, in the DC level setting circuit 4, a DC level D is set at the following value $$D = R_2 \times V_{DD}/(R_1 + R_2)$$

where $V_{DD}$ is a terminal voltage of the resistor R1. In this example, since $R_1$ is set equal to $R_2$, $D = V_{DD}/2$.

Further, an upper limit $V_T$ and a lower limit $V_B$ that are set by the dynamic range setting circuit 5 are expressed as follows:

$$V_T = (R_4 + R_5)V_{DD}/(R_3 + R_4 + R_5)$$

$$V_B = R_5 \times V_{DD}/(R_3 + R_4 + R_5)$$

When receiving an analog signal at a level higher than or equal to the upper limit $V_T$, the A/D converter 6 outputs data in which all of the n bits are a logic value "1." When receiving an analog signal at a level lower than or equal to the lower limit $V_B$, the A/D converter 6 outputs data in which all of the n bits are a logic value "0."

In this example, since $R_3$ is set equal to $R_5$, a center value $V_M$ of the dynamic range of the A/D converter 6 is equal to $V_{DD}/2$.

At this time point, input of an analog signal is substantially prohibited by the AGC amplifier 2. Therefore, the DC level that is set by the DC level setting circuit 4 is input to terminal AIN of the A/D converter 6. The A/D converter 6 converts this DC level from analog to digital and outputs a result (n-bit data) to the digital signal processing circuit 7. As described above, ideally the DC level is set equal to the center value $V_M$ of the dynamic range that is set by the dynamic range setting circuit 5. However, in practice, the resistance values of the resistors $R_1$–$R_5$ varies by several percent and hence the DC level does not completely coincide with the center value $V_M$. Therefore, the digital signal processing circuit 7 calculates a difference between the value that is received from the A/D converter 6 and corresponds to the DC level that is set by the DC level setting circuit 4 and the center value $V_M$ of the dynamic range and employs it as a DC offset.

At this time point, input of an analog signal to the DC level setting circuit 4 (and the A/D converter 6) is substantially prohibited by the AGC amplifier 2. Therefore, there occurs almost no influence of noise that is superimposed on an analog signal. It may therefore be sufficient to perform the above calculation only once. However, in view of possible influence of noise from the DC level setting circuit 4 or the dynamic range setting circuit 5, the digital signal processing circuit 7 performs the above calculation several times and employs an average of calculation results (i.e., differences) as a DC offset value. The DC offset value thus determined is stored in the register 31 at step S6.

After the offset value is stored in the register 31 in the above manner, the CPU 11 sets a normal AGC mode at step S7. That is, the CPU 11 controls the digital signal processing circuit 7 via the interface 12 to have it generate such an AGC signal that values that will be supplied from the A/D converter 6 from now on will be optimum for the transmission path used. The AGC signal is supplied to the AGC amplifier 2 via the integration circuit 9. As a result, the amplitude peak value of an analog signal that is output from the AGC amplifier 2 is controlled so as to be optimum for the A/D conversion even if the amplitude of an input signal that is input to the terminal 1 is too large or too small. In this manner, in the transmission path in which this offset compensation circuit is used, the optimum A/D conversion can be performed in any situations, for instance, even in a case where the amplitude peak value of an analog signal that is input to the terminal 1 is several times larger than in cases of other transmission paths.

An analog signal that is output from the AGC amplifier 2 is input to the analog signal processing circuit 3, where it is subjected to quadrature detection, for instance. The DC component is removed from a detected signal by the capacitor $C_1$, and a resulting signal is supplied to the DC level setting circuit 4. The DC level setting circuit 4 sets the DC level of the received analog signal to the prescribed value and supplies a resulting signal to terminal AIN of the A/D converter 6. The A/D converter 6 outputs, to the digital signal processing circuit 7, digital data corresponding to the amplitude level of the signal that is input to terminal AIN. In the digital signal processing circuit 7, the subtraction circuit 32 performs offset compensation by subtracting the offset value that is stored in the register 31 from the value that is input from the A/D converter 6, and outputs a resulting value from the terminal 8.

The above normal AGC mode process is repeated unless it is judged at step S8 that there has been no data supply for more than a predetermined time. The CPU 11 monitors data that is input from the A/D converter 6 to the digital signal processing circuit 7. If the CPU 11 judges that no analog signal is input to the terminal for more than the predetermined time, the process returns to step S3 to execute the offset detection process in the same manner as described above. In the above manner, the offset value stored in the register 31 is updated properly as time elapses. Therefore, even where the offset value varies over time, it can be compensated for correctly.

When the averaging is performed as described above at step S5, the level of a signal that is input to the A/D converter 6 is substantially equal to the DC level that is set by the DC level setting circuit 4, and is therefore lower than in a case where the AGC amplifier 2 is not squelched, that is, input of an analog signal is permitted. As a result, the averaging circuit that needs to be provided in the digital signal processing circuit 7 can be of a smaller scale.

Figure 5:
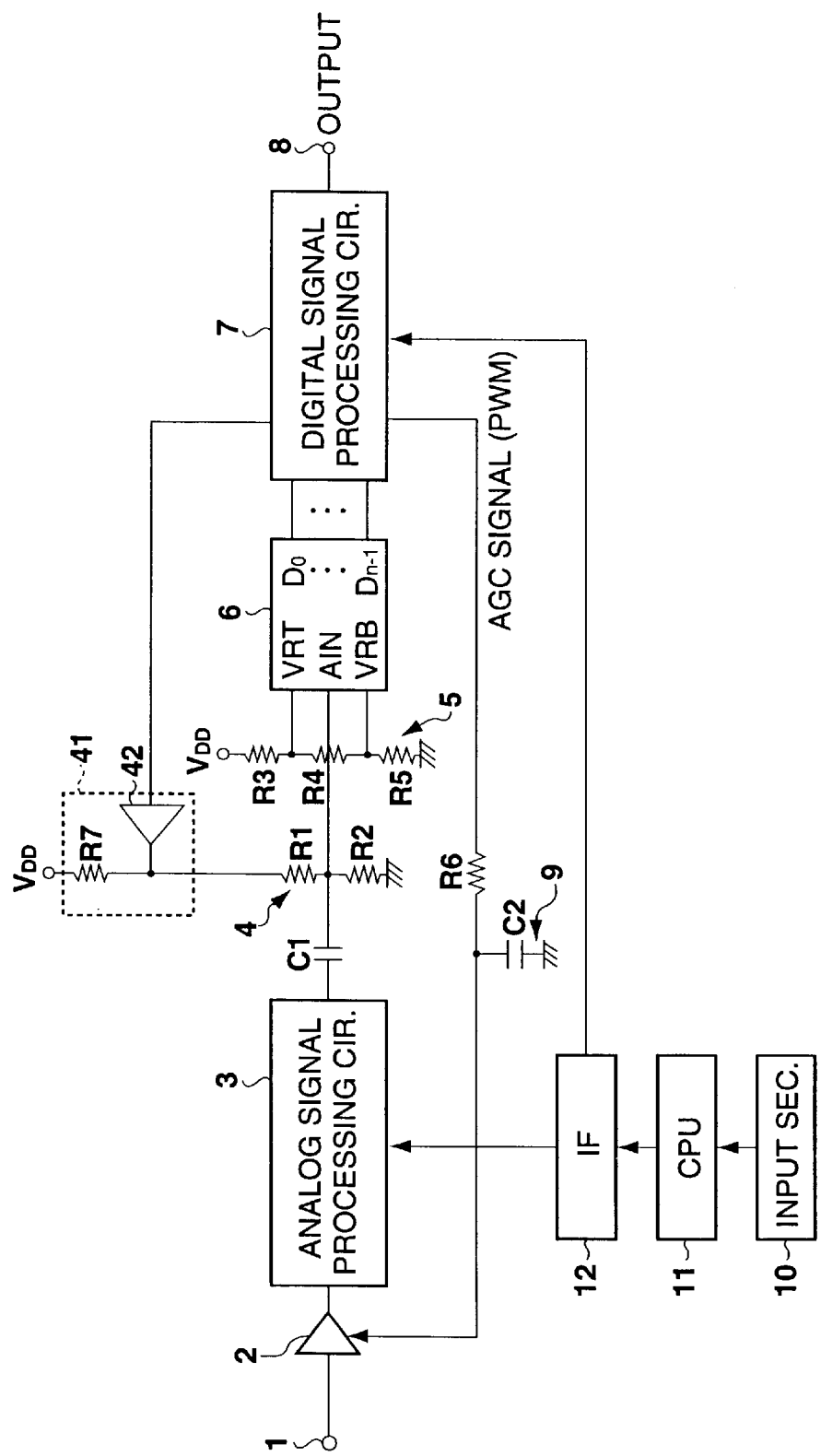
FIG. 5 is a block diagram showing an exemplary configuration of another offset compensation circuit according to the invention.

Although in the embodiment of FIG. 1 an offset is compensated for in the digital signal processing circuit 7, it can be compensated for by controlling the DC level setting circuit 4. FIG. 5 shows an example of such a configuration.

In an offset compensation circuit of FIG. 5, a voltage is supplied to the DC level setting circuit 4 via an adjustment circuit 41. The adjustment circuit 41 consists of a resistor R7 and a buffer amplifier 42. For example, the buffer amplifier 42 is an operational amplifier. The other part of the configuration is the same as shown in FIG. 1.

In the embodiment of FIG. 5, the digital signal processing circuit 7 supplies an analog signal having a value corresponding to an offset value that is stored in an internal register to the DC level setting circuit 4 via the buffer amplifier 42. As a result, the DC level to be set by the DC level setting circuit 4 is changed to the value corresponding to the offset value. In this manner, the DC level that is set by the DC level setting circuit 4 is controlled so as to be just equal to the center value of the dynamic range that is set by the dynamic range setting circuit 5.

As a result of the above-described offset compensation, the value of digital data that is output from the terminal 8 accurately corresponds to the amplitude of an analog signal. Therefore, it becomes possible to fully utilize the nominal resolution of the A/D converter 6.

Although the above embodiments are directed to the case where the invention is applied to a receiving circuit for receiving a digital transmission signal, the invention can be applied to any apparatus that converts an input analog signal to a digital signal.

As described above, in the offset compensation circuit and method according to the invention, input of an analog signal is prohibited when the detecting means detects an offset. Therefore, it becomes possible to detect and compensate for an offset with a simple configuration without being affected by noise.

What is claimed is:

1. An offset compensation circuit for eliminating a DC offset component of an analog-to-digital converter that converts an analog signal to a digital signal, comprising:

dynamic range setting means for setting a dynamic range of the analog-to-digital converter;

DC level setting means for setting a DC level of the analog signal that is input to the analog-to-digital converter;

detecting means for detecting an offset between a predetermined level in the dynamic range that is set by the dynamic range setting means and the DC level that is set by the DC level setting means;

prohibiting means for prohibiting input of the analog signal to the analog-to-digital converter while the detecting means detects the offset; and compensating means for compensating for the offset.

2. The offset compensation circuit according to claim 1, further comprising storing means for storing a value of the detected offset, wherein the detected offset value is stored in the storing means after an offset detecting operation is stopped after it has been performed for a predetermined time.

3. The offset compensation circuit according to claim 2, wherein a normal operation is started after the offset detecting operation is stopped, and during the normal operation the offset value that is stored in the storing means is subtracted from an output of the analog-to-digital converter.

4. The offset compensation circuit according to claim 1, wherein the detecting means detects, as the offset, a difference between a center value of the dynamic range and the DC level.

5. The offset compensation circuit according to claim 1, wherein the prohibiting means comprises an AGC amplifier for controlling an amplitude of the analog signal, and the AGC amplifier is controlled so as to minimize the amplitude of the analog signal that is input to the analog-to-digital converter while the detecting means detects the offset.

6. The offset compensation circuit according to claim 1, further comprising monitoring means for monitoring during the normal operation whether data is input, wherein the offset detecting operation is restarted when it is judged, as a result of monitoring, that no data has been input more than a predetermined time.

7. The offset compensation circuit according to claim 1, wherein the compensating means controls the DC level setting means in accordance with the offset.

8. An offset compensation method for eliminating a DC offset component of an analog-to-digital converter that converts an analog signal to a digital signal, comprising the steps of:

setting a dynamic range of the analog-to-digital converter;

setting a DC level of the analog signal that is input to the analog-to-digital converter;

detecting an offset between a predetermined level in the set dynamic range and the set DC level;

prohibiting input of the analog signal to the analog-to-digital converter while detecting the offset; and compensating for the detected offset.

9. The offset compensation method according to claim 8, wherein an offset detecting operation is stopped after it has been performed for a predetermined time, and a value of the detected offset is stored in a memory.

10. The offset compensation method according to claim 9, wherein a normal operation is started after the offset detecting operation is stopped, and during the normal operation the offset value that is stored in the storing means is subtracted from an output of the analog-to-digital converter.

11. The offset compensation method according to claim 8, wherein the offset is detected by detecting a difference between a center value of the set dynamic range and the set DC level.

12. The offset compensation method according to claim 8, wherein an operation of prohibiting input of the analog signal to the analog-to-digital converter is performed by minimizing an amplitude of the analog signal by controlling an AGC amplifier that is provided on an input side of the analog-to-digital converter.

13. The offset compensation method according to claim 8, further comprising the step of monitoring during the normal operation whether data is input, wherein the offset detecting operation is restarted when it is judged, as a result of monitoring, that no data has been input more than a predetermined time.

14. The offset compensation method according to claim 8, wherein offset compensation is performed by controlling the DC level in accordance with the offset.

* * * * *